United States Patent [19]

Duyal et al.

[11] Patent Number: 4,539,285

[45] Date of Patent: Sep. 3, 1985

[54] PHOTOSENSITIVE NEGATIVE DIAZO COMPOSITION WITH TWO ACRYLIC POLYMERS FOR PHOTOLITHOGRAPHY

[75] Inventors: Tulay Duyal, Manalapan; John E. Walls, Hampton, both of N.J.

[73] Assignee: American Hoechst Corporation, Somerville, N.J.

[21] Appl. No.: 589,434

[22] Filed: Mar. 14, 1984

[51] Int. Cl.³ ........................... G03C 1/60; G03F 7/08
[52] U.S. Cl. .................................. 430/157; 430/160; 430/175; 430/176; 430/302
[58] Field of Search ............... 430/176, 175, 160, 157, 430/302

[56] References Cited

U.S. PATENT DOCUMENTS

| | | |
|---|---|---|
| 2,822,271 | 2/1953 | Krieger . |
| 3,061,429 | 10/1962 | Neugebauer et al. . |
| 3,467,523 | 9/1969 | Seidel et al. . |
| 3,473,926 | 10/1969 | Abbott et al. . |
| 3,544,317 | 12/1970 | Yonezawa et al. . |
| 3,573,052 | 3/1971 | Gray et al. . |
| 3,933,499 | 1/1976 | Traskes . |
| 4,179,292 | 12/1979 | Klupfel et al. . |
| 4,186,069 | 1/1980 | Muzyczko et al. . |
| 4,232,105 | 11/1980 | Shinohara et al. . |
| 4,275,138 | 6/1981 | Kita et al. . |
| 4,288,520 | 9/1981 | Sprintschnik et al. . |
| 4,294,905 | 10/1981 | Okishi et al. ................... 430/175 |
| 4,304,832 | 12/1981 | Ohta et al. . |

Primary Examiner—Charles L. Bowers, Jr.
Attorney, Agent, or Firm—Richard S. Roberts

[57] ABSTRACT

An improved resin coated substrate is prepared by coating a suitable substrate, such as aluminum with a composition comprising a salt having the structure $A-N_2^+X^-$ wherein A is an aromatic or heterocyclic residue and X is an anion of an acid; and a binder composition comprising both an acrylic polymer and an acid containing acrylic copolymer.

18 Claims, No Drawings

PHOTOSENSITIVE NEGATIVE DIAZO COMPOSITION WITH TWO ACRYLIC POLYMERS FOR PHOTOLITHOGRAPHY

BACKGROUND OF THE INVENTION

The present invention relates to improved resin coated substrates. More particularly, this invention relates to an improved coated plates which employ novel resin compositions which are cleansable in aqueous solutions.

Still more particularly, the invention relates to aluminum substrates, the surface of which is coated with a composition containing a salt having the structure $A\text{-}N_2{}^+X^-$ wherein A is an aromatic or heterocyclic residue and X is an anion of an acid; and a binder composition comprising both an acrylic polymer and an acid containing acrylic copolymer.

Most photographic elements comprise a metal sheet substrate which is coated with diazonium compound in admixture with suitable binding resins, colorants, stabilizers, exposure indicators, surfactants, and the like.

While the art discloses a plethora of photosensitive compositions useful for lithographic purposes, their serviceability is limited by the need to develop them with solutions containing substantial amounts of organic solvents. This is undesirable since these solvents are costly and their effluent is environmentally harmful.

The present invention seeks to reduce or eliminate the need for such solvents in lithographic systems by providing a photographic element with a light sensitive coating using a particular class of binding resins such that the exposed element is developable with a substantially aqueous based developer composition. Simultaneously the element shows no substantial attack to its image areas and the removed non-image area resins are substantially not re-deposited or re-adhered back onto the element after removal and the image quality and length of run of a lithographic printing plate produced from the photosensitive composition is commercially acceptable.

SUMMARY OF THE INVENTION

The present invention provides a light sensitive composition and a photographic element comprising a substrate which is coated with said composition. The element is capable of being developed with a substantially aqueous developer after being imagewise expose to actinic radiation. Said composition comprises negative working, light sensitive diazonium salt and a binding resin composition comprising or consisting essentially of an acrylic polymer having the formula

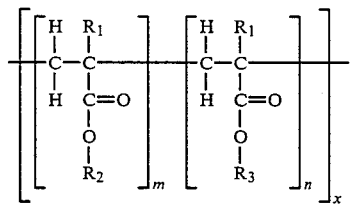

wherein:
$R_1$ is H or, $CH_3$
$R_2$ is $CH_3$, $CH_2CH_3$, or $(CH_2)_3CH_3$
$R_3$ is $CH_3$, $CH_2CH_3$, or $(CH_2)_3CH_3$
m=1 when $R_2$ is equal to $R_3$, and
n=1 when m=1, or
m=1 to 4 when $R_2$ is not equal to $R_3$, and
n=1 to 4 when m=1 to 4
x=300 to 500 when $R_2$ is equal to $R_3$
x=200 to 400 when $R_2$ is not equal to $R_3$
said acrylic polymer having an average molecular weight in the range of from about 35,000 to about 410,000; and
an acid containing acrylic copolymer having the formula

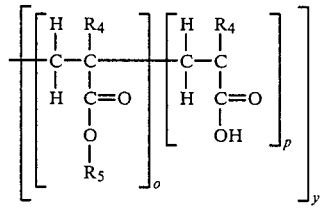

wherein:
$R_4$ is H or, $CH_3$
$R_5$ is $CH_3$, $CH_2CH_3$ or, $(CH_2)_3CH_3$
o is equal to 4 to 12, and
p is equal to 1, and
y is equal to 350 to 800
said copolymer having an average molecular weight in the range of from about 140,000 to about 1,450,000.

In this formula, the ratio of acid monomer portion to non-acid monomer part is in the range of from about 1:4 to 1:12. This corresponds to an acid component in the range of from about 8% to about 20% of the copolymer. If less than 8% of the copolymer is represented by the acid part, a photographic element prepared from the light sensitive composition is effectively non-developable, whereas is the acid portion is above about 20% the image areas are subject to excessive attack during development.

By the term "substantially aqueous developer" it is meant, one which contains aqueous solutions of salts and surfactants and less than about 10% by weight of organic solvents. Preferably the developer contains no more than about 5%, more preferably no more than about 2% and most preferably 0% of such organic solvents.

DETAILED DESCRIPTION OF THE PREFERRED EMBODIMENT

As the first step in the production of the photographic element, a sheet substrate such as aluminum and the alloys thereof, especially those aluminum compositions suitable for the manufacture of lithographic printing plates such as, Alcoa 3003 and Alcoa 1100, which may or may not have been pretreated by standard graining and/or etching and/or anodizing techniques as are well known in the art, and also may or may not have been treated with a composition, such as polyvinyl phosphonic acid, suitable for use as a hydrophilizing layer for lithographic plates is coated with the light sensitive composition disclosed herein.

The photosensitive sheet material is then exposed through a mask or transparency, to a radiation source and the exposed sheet then developed for removal of unexposed photosensitive materials.

The light sensitive composition comprises an admixture of a diazonium salt, and each of the previously mentioned acrylic polymers and acid containing acrylic copolymers. The mixture is usually prepared in a solvent composition which is compatible with all the composition ingredients. The composition is then coated on the substrate and the solvent dried off. The composition may also contain other art recognized ingredients such as colorants, acid stabilizers and exposure indicators.

Diazonium compounds most commonly employed in the preparation of light sensitive compositions suitable for the present application may be characterized by the generic structure $A\text{-}N_2^+X^-$, wherein A is an aromatic or heterocylic residue and X is the anion of an acid.

Specific examples of light sensitive diazonium materials useful as aforementioned include higher molecular weight compositions obtained, for example, by the condensation of certain aromatic diazonium salts in an acid condensation medium with active carbonyl compounds such as formaldehyde, as disclosed for example in U.S. Pat. Nos. 2,063,631 and 2,667,415. A preferred class of diazonium compounds is described in U.S. Pat. No. 3,849,392.

A most preferred diazonium salt is the polycondensation product of 3-methoxy-4-diazo-diphenyl amine sulfate and 4,4'-bis-methoxy methyl-diphenyl ether, precipitated as mesitylene sulfonate, as taught in U.S. Pat. No. 3,849,392.

The acrylic polymer useful for the practice of the present invention has an average molecular weight in the range of from about 35,000 to about 410,000. A preferred average molecular weight range is from about 100,000 to about 300,000; more preferably 150,000 to about 225,000 acrylic polymers useful with in the context of the invention non-exclusively include ELVACITE®, available from E. I. duPont de Nemours Company.

The acid containing acrylic copolymer useful for the present invention has an average molecular weight in the range of from about 140,000 to about 1,450,000. Preferably, the average molecular weight of the copolymer falls in the range of from about 175,000 to about 700,000, more preferably 200,000 to about 375,000. One particularly preferred copolymer useful within the context of the present invention is PMMA/MAA 1539, available from ESSCHEM in Philadelphia, Pa.

Suitable acid stabilizers useful within the context of the present invention include phosphoric, citric, tartaric and p-toluene sulfonic acids.

Exposure indicators useful in conjunction with the present invention include para phenyl azo diphenyl amine, Calcozine Fuchine dyes and Crystal Violet and Methylene Blue dyes.

Non-limiting examples of colorants useful with the photographic element of the present invention include such dyes as Acetosol Fire Red 3GLS, Sandolan Eosin E-G, Acetosol Green BLS, Genacryl Blue 3G, Sandolan Cyanine N-6B, Sandoplast Blue R, Atlantic Alizarine Milling Blue FFR 200, Neozapon Fiery Red BL, Erythrosine, Methylene Blue IaD Extra, Victoria Pure Blue FGA; and such pigments as Green Gold Pigment and Sunfast Violet.

The diazonium salt is perferably present in the coating composition in an amount of from about 15% to about 45% by weight of the solid composition components. A more preferred range is from about 20% to 40% and most preferably from about 25% to 35%.

The acrylic polymer resin is preferably present in the coating composition in an amount of from about 15% to about 45% by weight of the solid composition components. A more preferred range is from about 20% to 40% and most preferably from about 25% to 35%.

The acid containing acrylic copolymer is preferably present in the coating composition in an amount of from about 20% to about 50% by weight of the solid composition components. A more preferred range is from about 25% to 45% and most preferably from about 30% to 40%.

The acid stabilizer, when one is used, is preferably present in the coating composition in an amount of from about 0.5% to about 7% by weight of the solid composition components. A more preferred range is from about 1.5% to 5% and most preferably from about 2.0% to 4%.

The exposure indicator, when one is used, is preferably present in the coating composition in an amount of from about 0.1% to about 1.5% by weight of the solid composition components. A more preferred range is from about 0.2% to 1.0% and most preferably from about 0.25% to 0.75%.

The colorant, when one is used, is preferably present in the coating composition in an amount of from about 0.1% to about 2.5% by weight of the solid composition components. A more preferred range is from about 0.2% to 1.5% and most preferably from about 0.25% to 0.75%.

Suitable solvents which may be used as a medium to combine the ingredients of the present composition include Methyl Cellosolve, ethylene glycol ethers, butyrolactone, such alcohols as ethyl alcohol and n-propanol, and ketones such as methyl ethly ketone. In general said solvents are evaporated from the coating once it is applied to an appropriate substrate, however some insignificant amount of solvent may remain as a residue.

Substrates useful for production of the photographic element of the present invention non-exclusively include transparent films, aluminum alloys, silicon and similar materials which are well known in the art.

In the production of lithographic printing plates, an aluminum containing substrate is first preferably grained by art recognized methods such as by means of a wire brush, slurry of particulates or electrochemical means, for example in a hydrochloric acid electrolyte. The grained plate may then be anodized, for example in sulfuric or phosphoric acid in a manner well known in the art. The grained and anodized surface may then be rendered hydrophilic, for example, by treatment with polyvinyl phosphonic acid, sodium silicate, or the like, which means are also known to skilled artisan. A most preferred surface is prepared according to the teachings of U.S. Pat. No. 4,153,461. The thusly prepared plate is then coated with the composition of the present invention, dried, exposed to actinic radiation through an appropriate mask and developed with an aqueous based developer.

Plates made according to the disclosure are developable with environmentally sound developers and satisfy the handling and lithographic demands such as good storability, press performance, ease of development, exposure speed and image quality.

A suitable developer useful for the photographic element of the present invention includes an aqueous alkaline solution containing (a) a sodium, potassium or lithium salt of octyl, decyl or dodecyl monosulfate; and (b) a sodium, lithium, potassium or ammonium metasilicate salt; and (c) a lithium, potassium, sodium or ammonium borate salt; and (d) an aliphatic dicarboxylic acid, or sodium, potassium or ammonium salt thereof having from 2 to 6 carbon atoms; and (e) di- and/or tri-sodium or -potassium phosphate.

The following non-limiting examples serve to demonstrate the invention. Example 1 illustrates the invention whereas the subsequent examples are comparative.

EXAMPLE 1

A solution is prepared by dissolving the following ingredients in 86.0 parts of 2-methoxy ethanol; 3.9 parts of the condensation product of 3-methoxy-4-diazo diphenyl amine sulfate and 4,4'-bis methoxy methyl diphenyl ether isolated as the mesitylene sulfonate as described in U.S. Pat. No. 3,849,392; 7.35 parts of a polymethyl methacrylate/methacrylic acid copolymer having a ratio of 83.5:16.5 an average molecular weight of 210,000; 2.16 parts of a methyl methacrylate homopolymer having an average molecular weight of 179,000, 0.03 parts of 4-phenyl azodiphenyl amine, 0.17 parts of Acetosol Fire Red 3GLS dye, and 0.39 parts of phosphoric acid (85%).

After all the components are dissolved, the solution is filtered and whirler coated onto a lithographic grade 3003 alloy aluminum sheet. The aluminum sheet used is first slurry grained and anodized and is hydrophilized with polyvinyl phosphonic acid. The coated plate is dried and subsequently exposed to a mercury vapor light through a negative test flat with 147 mJ/cm$^2$ energy source which is capable of yielding a solid six on a 21-step Stouffer sensitivity guide after development.

The exposed plate is developed with an aqueous developing composition having a pH of 9.7 and is described in U.S. Pat. No. 4,436,807. The unexposed portions are removed by dissolution with no tendency towards the unwanted redeposit of the removed coating components onto the image. The prepared plate is run on a sheet-fed press and is observed to produce 70,000 acceptable copies.

EXAMPLE 2

Example No. 1 is repeated except that the polymethyl methacrylate/methacrylic acid copolymer is replaced with a copolymer having the same molecular weight but an inert monomer to methacrylic acid ratio of 95:5.

Upon development the non-exposed areas are only very slowly removed. After extending developing time by a factor of five the background appears not to be fully desensitized. When run on the press the plate is observed to scum. Attempts made to clean the plate do not result is a plate giving acceptable quality printing.

EXAMPLE 3

Example No. 1 is repeated except that the polymethylmethlyacrylate/methacrylic acid copolymer is replaced with a copolymer having the same molecular weight but an inert monomer to methacrylic acid ratio of 60:40. Upon development the non-exposed areas are quickly removed. The image area is observed to be attacked as evidenced by reduced image intensity, stepwedge roll-back and loss of high-light image areas.

Under normal press conditions the image is observed to fail after 20,000 copies.

EXAMPLE 4

Example No. 1 is repeated except that the methyl methacrylate homopolymer is omitted from the formulation. Upon development the non-exposed areas are quickly removed. As development proceeds, the image is observed to be removed so that after one minute most of the usage image is removed. Due to the poor quality of the image, it is not possible to run the plate on press to produce any usable copies.

What is claimed is:

1. A photosensitive composition which comprises in admixture:

(a) from about 15% to about 45% by weight of a light sensitive, negative working diazonium salt; and (b) from about 15% to about 45% by weight of an acrylic polymer having the formula

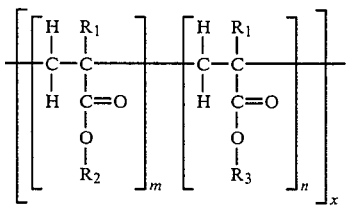

wherein
$R_1$ is H or, CH$_3$
$R_2$ is CH$_3$, CH$_2$CH$_3$, or (CH$_2$)$_3$CH$_3$
$R_3$ is CH$_3$, CH$_2$CH$_3$, or (CH$_2$)$_3$CH$_3$
$m = 1$ when $R_2$ is equal to $R_3$, and
$n = 1$ when $m = 1$, or
$m = 1$ to 4 when $R_2$ is not equal to $R_3$, and
$n = 1$ to 4 when $m = 1$ to 4
$x = 300$ to 500 when $R_2$ is equal to $R_3$
$x = 200$ to 400 when $R_2$ is not equal to $R_3$
said acrylic polymer having an average molecular weight in the range of from about 35,000 to about 410,000; and (c) from about 20% to about 50% by weight of an acid containing acrylic copolymer having the formula

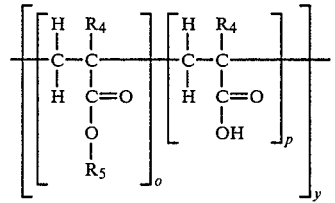

wherein:
$R_4$ is H or, CH$_3$
$R_5$ is CH$_3$, CH$_2$CH$_3$ or, (CH$_2$)$_3$CH$_3$
$o$ is equal to 4 to 12, and
$p$ is equal to 1, and
$y$ is equal to 350 to 800
said copolymer having an average molecular weight in the range of from about 140,000 to about 1,450,000.

2. The composition of claim 1 wherein the diazonium salt is present in an amount of from about 20% to about 40% by weight of the composition.

3. The composition of claim 1 wherein the acrylic polymer is present in an amount of from about 20% to about 40% by weight of the composition.

4. The composition of claim 1 wherein the acid containing acrylic copolymer is present in an amount of from about 25% to about 45% by weight of said composition.

5. The composition of claim 1 wherein the diazonium salt is present in an amount of from about 20% to about 40%, and wherein the acrylic polymer is present in an amount of from about 20% to about 40%, and wherein the acid containing acrylic copolymer is present in an amount of from about 25% to about 45% by weight of said composition.

6. The composition of claim 1 wherein the said copolymer has an average molecular weight in the range of about 175,000 to 700,000.

7. The composition of claim 1 wherein the said copolymer has an average molecular weight of about 200,000 to about 375,000.

8. The composition of claim 1 wherein the said acrylic polymer has an average molecular weight in the range of from about 100,000 to about 300,000.

9. The composition of claim 1 wherein the said acrylic polymer has an average molecular weight in the range of from about 100,000 to about 380,000.

10. The composition of claim 1 wherein the diazonium salt is the polycondensation product of 3-methoxy-4-diazo-diphenyl amine sulfate and 4,4'-bis-methoxy methyl-diphenyl ether, precipitated as mesitylene sulfonate.

11. The composition of claim 1 wherein the said acrylic polymer has an average molecular weight in the range of from about 100,000 to about 300,000; and said acrylic copolymer has an average molecular weight in the range of from about 170,000 to about 700,000; and wherein said diazonium salt is the polycondensation product of 3-methoxy-4-diazo-diphenyl amine sulfate and 4,4'-bis-methoxy methyl-diphenyl ether, precipitated as mesitylene sulfonate.

12. The composition of claim 1 further comprising one or more ingredients selected from the group consisting of exposure indicators, acid stabilizers and colorants.

13. A photosensitive element which comprises a substrate and the composition of claim 1 coated on said substrate.

14. A lithographic printing plate which comprises an aluminum containing substrate and the composition of claim 1 coated on said substrate.

15. A lithographic printing plate which comprises an aluminum containing substrate and the composition of claim 11 coated on said substrate.

16. A lithogrpahic printing plate which comprises an aluminum containing substrate, at least one surface of which has been grained, anodized and hydrophilized; and the composition of claim 1 coated onto said treated surface.

17. A lithographic printing plate which comprises an aluminum containing substrate, at least one surface of which has been grained, anodized and treated with a polyvinyl phosphoric acid containing hydrophilizing composition; and the composition of claim 11 coated ont said treated surface.

18. A lithographic printing plate which comprises an aluminum containing substrate, at lease one surface of which has been grained and hydrophilized; and the composition of claim 1 coated onto said treated surface.

* * * * *